(12) United States Patent
Neumeister et al.

(10) Patent No.: US 12,348,222 B2
(45) Date of Patent: Jul. 1, 2025

(54) DRIVER CIRCUIT AND METHOD FOR CONTROLLING A SEMICONDUCTOR SWITCH

(71) Applicant: Siemens Aktiengesellschaft, Munich (DE)

(72) Inventors: Matthias Neumeister, Erlangen (DE); Markus Pfeifer, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 50 days.

(21) Appl. No.: 18/546,349

(22) PCT Filed: Nov. 24, 2021

(86) PCT No.: PCT/EP2021/082842
§ 371 (c)(1),
(2) Date: Aug. 14, 2023

(87) PCT Pub. No.: WO2022/174948
PCT Pub. Date: Aug. 25, 2022

(65) Prior Publication Data
US 2024/0120914 A1    Apr. 11, 2024

(30) Foreign Application Priority Data
Feb. 16, 2021    (EP) ..................................... 21157318

(51) Int. Cl.
*H03K 17/16*    (2006.01)
(52) U.S. Cl.
CPC ......... *H03K 17/168* (2013.01); *H03K 17/163* (2013.01)

(58) Field of Classification Search
CPC .. H03K 17/168; H03K 17/163; H03K 17/166; H03K 17/16; H03K 17/18;
(Continued)

(56) References Cited

U.S. PATENT DOCUMENTS

| 5,926,012 | A | 7/1999 | Takizawa et al. | 323/284 |
| 2010/0019808 | A1 | 1/2010 | Fuma | 327/109 |

(Continued)

FOREIGN PATENT DOCUMENTS

| EP | 1 282 230 | 2/2003 |
| EP | 3 270 513 | 1/2018 |

OTHER PUBLICATIONS

Search Report for International Application No. PCT/EP2021/082842, 12 pages, Mar. 3, 2022.
(Continued)

*Primary Examiner* — Jung Kim
(74) *Attorney, Agent, or Firm* — Slayden Grubert Beard PLLC

(57) ABSTRACT

Some circuits for controlling a semiconductor switch include: a contact for connection to a control terminal of the semiconductor switch; and a device to carry out a measurement of a value dependent on the level of the current flowing through the semiconductor switch, in the course of a switch-off process of the semiconductor switch. The value is either the level of the gate current at a point in time or in a time window after the start of the switch-off process or a timespan from the start of the switch-off process until a definable threshold value of the voltage drop across the semiconductor switch is reached. Depending on the size of the value, the device activates a control measure to reduce the change over time in the current flowing through the semiconductor switch.

15 Claims, 8 Drawing Sheets

(58) Field of Classification Search
CPC .......... H03K 17/223; H03K 2017/226; H03K 17/30; H03K 17/302; H03K 17/04106; H03K 17/0406; H03K 17/041; H03K 17/04113; H03K 17/0412; H03K 17/04123; H03K 17/04126; H03K 17/0416; H03K 17/08; H03K 17/04163; H03K 17/04166; H03K 17/04206; H03K 17/042; H03K 17/04213; H03K 17/08104; H03K 17/08112; H03K 17/081; H03K 17/0812; H03K 17/0814; H03K 17/567; H03K 17/56; H03K 17/687; H03K 17/60; H03K 17/6872
See application file for complete search history.

(56) References Cited

U.S. PATENT DOCUMENTS

2012/0182051 A1    7/2012  Aoki ........................ 327/109
2015/0318848 A1   11/2015  Kandah
2018/0145676 A1*   5/2018  Tran .............. H03K 19/017509

OTHER PUBLICATIONS

Search Report for EP Application No. 21157318.3, 7 pages, Jul. 15, 2021.

* cited by examiner

DRIVER CIRCUIT AND METHOD FOR CONTROLLING A SEMICONDUCTOR SWITCH

CROSS-REFERENCE TO RELATED APPLICATIONS

This application is a U.S. National Stage Application of International Application No. PCT/EP2021/082842 filed Nov. 24, 2021, which designates the United States of America, and claims priority to EP Application No. 21157318.3 filed Feb. 16, 2021, the contents of which are hereby incorporated by reference in their entirety.

TECHNICAL FIELD

The present disclosure relates to switches. Various embodiments of the teachings herein may include methods and/or systems for controlling a semiconductor switch.

BACKGROUND

When switching off semiconductor switches such as IGBTs, switch-off overvoltages occur due to connected inductances. The connected inductances can be both inductive components and stray inductances, i.e. parasitic elements such as line inductances for example. The resulting switch-off overvoltages can be higher than the maximum permissible blocking voltage of the semiconductor switch and thus reduce its service life or, in extreme cases, even immediately destroy it.

Since the magnitude of the switch-off overvoltages is influenced, among other things, by the switch-off speed, the switch-off overvoltages are more significant in newer IGBT generations, since these components are designed for faster switching. Fast switching is generally preferred because it reduces the switching losses that occur.

It is known to detect excessively high switch-off overvoltages using the time derivative of the collector current ($dI_c/dt$) or using the time derivative of the collector-emitter voltage ($dU_{CE}/dt$). This detection can take place directly in the driver circuit of the semiconductor switch and countermeasures such as temporarily switching the semiconductor switch back on can also be taken directly there. As a result, the countermeasures are implemented quickly. With earlier generations of IGBTs, a sufficient reaction speed was thus available to initiate countermeasures and prevent damage to the semiconductor switch in the remaining time of—roughly—1 µs according to one of the measurement methods described.

In the case of modern semiconductor switches, however, due to their high switching speed, the time remaining after one of the measurement methods described above to initiate countermeasures is shorter than previously and can be in the region of less than 100 ns. Even if there is a reaction in the driver circuit, this time may be too short to be able to reliably rule out damage to the semiconductor switch. As a general countermeasure, switching off can be delayed independently of the specific situation of the semiconductor switch, but this is very unattractive since it negates the advantage of fast switching, namely the reduction in switching losses.

SUMMARY

The teachings of the present disclosure include driver circuits for a semiconductor switch which avoid the disadvantages mentioned at the outset, and enable an improved response to a potentially excessively high switch-off voltage. and corresponding operating methods for a semiconductor switch. As an example, some embodiments include a driver circuit (12) for controlling a semiconductor switch (10), comprising a contact for connection to a control terminal (11) of the semiconductor switch (10) and a device that is designed in the course of a switch-off process of the semiconductor switch (10) to carry out a measurement of a value dependent on the level of the current flowing through the semiconductor switch (10), wherein the value is either the level of the gate current ($71a \ldots d$) at a point in time (72) or in a time window after the start (74) of the switch-off process or a timespan from the start (74) of the switch-off process until a definable threshold value (33) of the voltage drop across the semiconductor switch (10) is reached, and depending on the size of the value, a control measure to reduce the change over time in the current flowing through the semiconductor switch (10).

In some embodiments, the device is designed to temporarily switch the semiconductor (10) back on as a control measure.

In some embodiments, the device is designed to change the gate voltage as a control measure.

In some embodiments, the device can be designed to switch to a higher gate resistance as a control measure.

In some embodiments, the device is designed to give a signal to a higher-level controller (20) depending on the magnitude of the value.

In some embodiments, the device is designed to store the measured value during a first switch-off process and to determine a difference between the value measured in the subsequent switch-off process and the stored value during a subsequent switch-off process, in particular the next switch-off process, and to control the control measure based on the difference.

In some embodiments, the device is designed to determine a result value from the measured value using a stored value table and to control the control measure based on the result value.

In some embodiments, the device is designed to use at most 10% of the nominal voltage of the semiconductor switch (10) as a threshold value (33) of the collector-emitter voltage.

In some embodiments, the device is designed to define the start (74) of a switch-off process using a threshold value for the gate voltage.

In some embodiments, the device is designed to define the start (74) of a switch-off process using a control command from the higher-level controller (20).

In some embodiments, the device is designed to determine the start of a switch-off process based on the value of a control voltage, wherein the control voltage is a voltage value between an output stage of the driver circuit (12) and a gate resistor.

In some embodiments, the device is designed to define a time in which it is possible to carry out the control measure by means of a delay circuit.

In some embodiments, the device is designed to set a time in which the implementation of the control measure is possible, determined by means of a voltage measurement at a Z-diode, which is connected to the collector-emitter voltage by means of a voltage divider.

As another example, some embodiments include a semiconductor switch (10), in particular IGBT (10), MOSFET or SiC-based MOSFET, with a driver circuit (12) as claimed in one of the preceding claims.

As another example, some embodiments include a method for controlling a semiconductor switch (10), in which a measurement of a value dependent on the level of the current flowing through the switch is carried out during the course of a switch-off process of the semiconductor switch (10), wherein the value is either the level of the gate current (71a . . . d) at a point in time (72) after the start (74) of the switch-off process or a timespan from the start (74) of the switch-off process until a definable threshold value (33) of the voltage drop across the switch is reached and depending on the size of the value, a control measure is taken to reduce the change over time in the current flowing through the semiconductor switch (10).

BRIEF DESCRIPTION OF THE DRAWINGS

Further advantages and features can be found in the following description of exemplary embodiments with reference to the figures. In the figures, the same reference characters designate the same components and functions. In the drawings.

DETAILED DESCRIPTION

Figure 1:
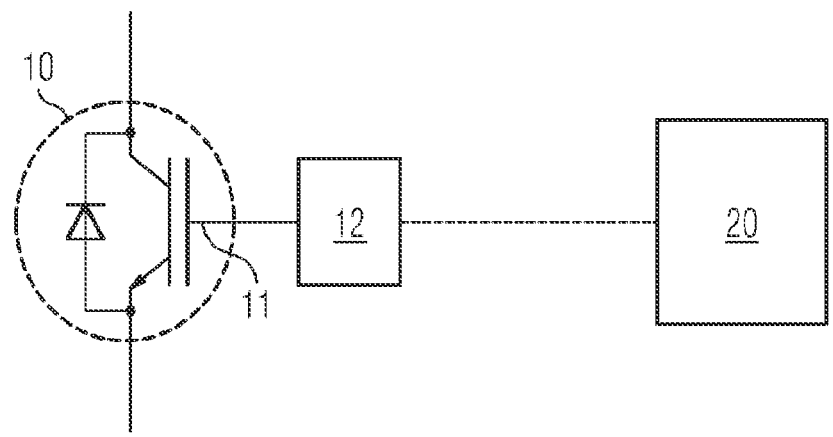
FIG. 1 shows a block diagram of an IGBT with a driver circuit and a higher-level controller connected to the driver circuit incorporating teachings of the present disclosure.

Various embodiments of the teachings herein include driver circuits for controlling a semiconductor switch. An example circuit comprises a contact for connection to a control terminal (gate terminal) of the semiconductor switch. It also includes a device in the form of a circuit which is designed to carry out a measurement of a value dependent on the magnitude of the current flowing through the switch in the course of a switch-off process of the semiconductor switch. Depending on the specific semiconductor switch, the current flowing through the switch is either the collector current or the drain current.

In some embodiments, this value is the level of the gate current at a point in time after the start of the switch-off process.

In some embodiments, this value is a timespan from the start of the switch-off process until a definable threshold value of the voltage drop across the semiconductor switch is reached. Depending on the specific semiconductor switch, the voltage is referred to as collector-emitter voltage or source-drain voltage.

The device is also designed to take a control measure to reduce the change over time in the current flowing through the semiconductor switch, depending on the size of the value. In this case, the reduction means a reduction in the magnitude of the change over time, i.e. a slowing down of the change in current, regardless of its direction.

In an example method incorporating teachings of the present disclosure for controlling a semiconductor switch, a measurement of a value dependent on the level of the collector current is carried out during the course of a switch-off process of the semiconductor switch. In some embodiments, this value is the level of the gate current at a point in time after the start of the switch-off process. In some embodiments, this value is a timespan from the start of the switch-off process until a definable threshold value of the collector-emitter voltage is reached. Depending on the magnitude of the value, a control measure is taken to reduce the collector current change.

The times at which a measurement is available with the method incorporating teachings of the present disclosure and the driver circuit, which provides information about the occurrence of an excessive switch-off overvoltage, are well ahead of those that can be reached with known methods. For example, the $dU_{CE}/dt$ measurement can only be made when the collector-emitter voltage has already risen to about half the nominal voltage. On the other hand, the threshold value can be set to a significantly lower value.

The teachings herein thus enable a high collector current to be detected much earlier and therefore allows a reaction to an excessively high collector current even in the case of semiconductor switches that switch very quickly.

In some embodiments, the device can be designed to temporarily switch the semiconductor switch back on as a control measure. The device can also be designed to change the gate voltage as a control measure. Furthermore, the device can be designed to switch to a higher gate resistance as a control measure. The measures mentioned result in the collector current dropping less sharply or even rising again, at least for a short time. Accordingly, the collector-emitter voltage rises less sharply or falls for a short time. This time is available for the further dissipation of the inductively stored energy and thus ensures a reduction in the overvoltage that occurs when the semiconductor switch is finally switched off as a result.

The device can be designed to give a signal to a higher-level controller depending on the size of the value. This means that the higher-level controller of the device of which the semiconductor switch is a part, for example a converter, can react. So, for example, it can respond to the receipt of such a signal with an emergency operation.

The device can be designed to store the measured value during a first switch-off process and to determine a difference between the value measured in the subsequent switch-off process and the stored value during a subsequent switch-off process, in particular the next switch-off process, and to control a switching back on of the semiconductor switch based on the difference. This ensures that calibration to the properties of the specific semiconductor switch is unnecessary. The manufacturing tolerance of the semiconductor switches could otherwise result in the driver circuit having to be adapted to the individual switch. Furthermore, it is advantageously achieved that the influence of other disturbance variables, such as the temperature, becomes irrelevant, even if this influence is significant or even predominant compared to the influence of the collector current on the measured value. The prerequisite is that the disturbance variables show only a slight change between two consecutive switch-off processes. However, since the switch-off processes follow one another with frequencies of 10 kHz or more, this is the case for the temperature.

In some embodiments, the device can be designed to determine a result value using the measured value and a stored value table and to derive the control measure from the result value. In this case, a relative determination is not made, as in the comparison with a previous measured value, but an absolute determination of the result. However, a table of values must be available for this. It is useful if this table of values also contains other influencing variables such as temperature. Accordingly, these influencing variables must also be entered into the table together with the measured value in order to obtain an instantaneous result.

The device can be designed to use at most 10% of the nominal voltage of the semiconductor switch, in particular at most 5%, as the threshold value for the collector-emitter voltage. If such a small value is used, the measurement period ends earlier and the value is available earlier. This increases the time that remains for a reaction to a possibly excessively high collector current.

The device can be designed to determine the start of a switch-off process using a threshold value for the gate voltage. For example, with a typical wiring of the gate contact, a drop below a gate voltage of 14 V can be used as a trigger to define the start of the switch-off process.

The device can be designed to determine the start of a switch-off process using a control command from the higher-level controller.

In some embodiments, the device is designed to define the start of a switch-off process based on the value of a control voltage, the control voltage being a voltage value between an output stage of the driver circuit and a gate resistor.

The device can be designed to define a time in which it is possible to carry out the control measure by means of a delay circuit. For example, an output signal which triggers the control measure can be grounded by a semiconductor switch outside of this time. The time itself is started using another signal and ended by a delay that is determined by circuitry, for example. This circuitry-related delay can be determined, for example, by an RC element with a subsequent Schmitt trigger.

In some embodiments, the device can be designed to set a time in which the implementation of the control measure is possible, by means of a voltage measurement at a Z-diode, which is connected to the collector-emitter voltage by means of a voltage divider. Tests have shown that this voltage measurement is advantageous because the structure is very simple and generates a clearly pronounced voltage plateau while the collector-emitter voltage is rising, by which the time for useful intervention in the switch-off process can be very precisely defined.

The driver circuit and the method can be used in a circuit with a semiconductor switch such as an IGBT switch. The invention is not limited to IGBTs, but can equally be used with MOSFETs, in particular silicon carbide (SiC)-based MOSFETs. In a known manner, then, references to the collector are to be understood as the drain and references to the emitter are to be understood as the source.

FIG. 1 shows a block diagram of a circuit part that includes an IGBT 10 incorporating teachings of the present disclosure. The IGBT 10 is an example of all semiconductor switches for which the teachings herein can be applied. The IGBT 10 can be part of a circuit that forms a half-bridge or a converter, for example. For this purpose, the IGBT 10 is connected to further IGBTs or other semiconductor switches and is controlled by a higher-level controller 20 in order to achieve the purpose of the circuit. For this purpose, the IGBT 10 is switched with a pulse width modulation with a frequency of 10 kHz, for example.

The hardware-related control of the IGBT 10, i.e. the loading of its gate terminal 11 with voltage and current, is carried out by a driver 12. The driver 12 is connected to the gate terminal 11 of the IGBT 10 on the one hand and to the controller 20 on the other. In addition to converting control signals from the controller 20, the driver 12 also has the task of controlling processes that require such a rapid intervention that feedback to the controller 20 and waiting for control signals from there would take too long. This task includes a reaction to a possible overvoltage, which occurs via the IGBT 10 when the IGBT 10 is switched off. The reason for such overvoltage lies in inductively stored energy, which counteracts the change in current during the shutdown and, depending on the specific design of the circuit, for example existing capacitances, and the size of the stored energy, leads to a higher or lower overvoltage. If the voltage applied across the IGBT 10 exceeds its blocking capability, it can be damaged or destroyed.

If the switch-off speed, i.e. the change in the current over time, is not too high compared to the time in which the inductively generated overvoltage is automatically reduced, the resulting overvoltage also remains low. However, modern IGBTs are being optimized for ever faster switching processes in order to reduce the switching losses that occur. A general artificial extension of the switch-off time counteracts this improvement and is therefore normally not an option. In known driver circuits, the switch-off speed is therefore limited, if necessary, to values that avoid a damaging overvoltage by briefly switching the IGBT 10 on again depending on the situation.

Figure 2:
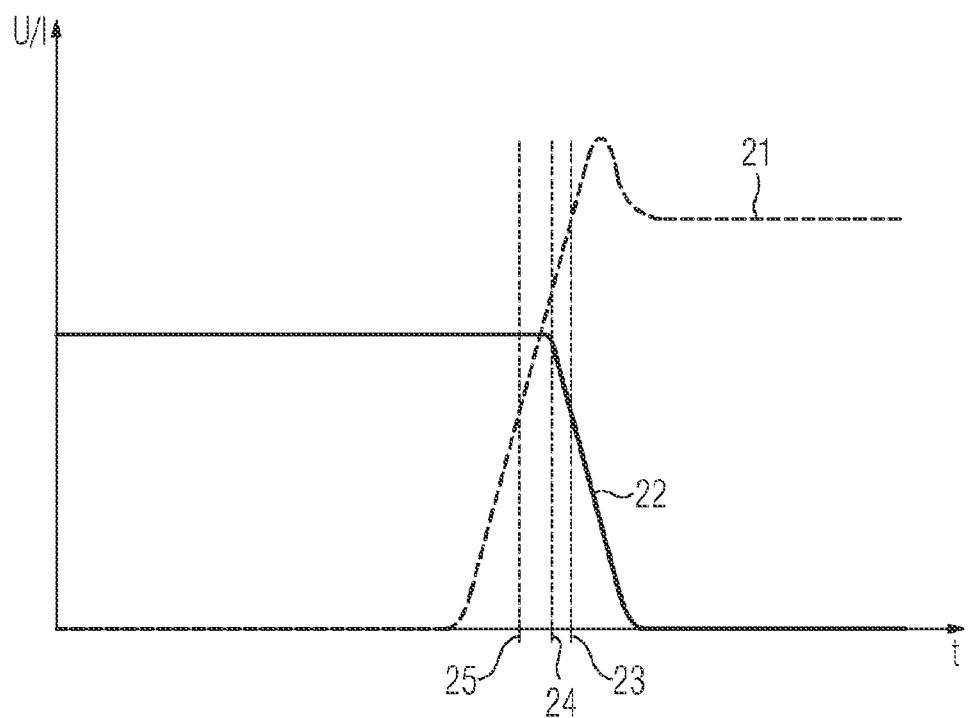
FIG. 2 shows a diagram with highly schematic current and voltage curves during a switch-off process of the IGBT incorporating teachings of the present disclosure.

In order to be able to switch on depending on the situation, the emerging overvoltage must be detected. In known driver circuits, this is done, for example, by measuring $dU_{CE}/dt$, i.e. the change over time in the collector-emitter voltage, or $dI_C/dt$, i.e. the change over time in the collector current. These measurements are only possible when the respective changes occur during the switch-off process and are then large enough to allow reliable measurements. This is only possible about half-way through the switch-off reaction, i.e. when the current actually starts or the collector-emitter voltage actually rises. At the end of this the overvoltage already arises, if such occurs. FIG. 2 shows a highly schematic and simplified switch-off process for a given IGBT. The voltage curve 21 of the collector-emitter voltage and the current curve 22 of the collector current are shown. The overvoltage results from the point in time 23, as can be seen from the voltage curve 21. A measurement of the current change $dI_C/dt$ is possible at point in time 24, which is only slightly before the onset of the overvoltage. A measurement of the voltage change $dU_{CE}/dt$ is possible at point in time 25. Point in time 25 is still slightly before point in time 24 and therefore allows a little more time until the overvoltage begins at point in time 23.

Depending on the switching speed of the IGBT under consideration, the time that remains for a reaction, i.e. the distance between point in time 23 and one of the points in time 24, 25, can be in the region of µs and be sufficient to limit the speed of the current change by a switching action of the driver 12. In the case of particularly fast IGBTs, the time remaining for a reaction can also be in the region of just 100 ns. This time is too short for a reaction even for the driver 12, since even the low parasitic inductances present are too high for a reversal of the IGBT in such a time frame.

Figure 3:
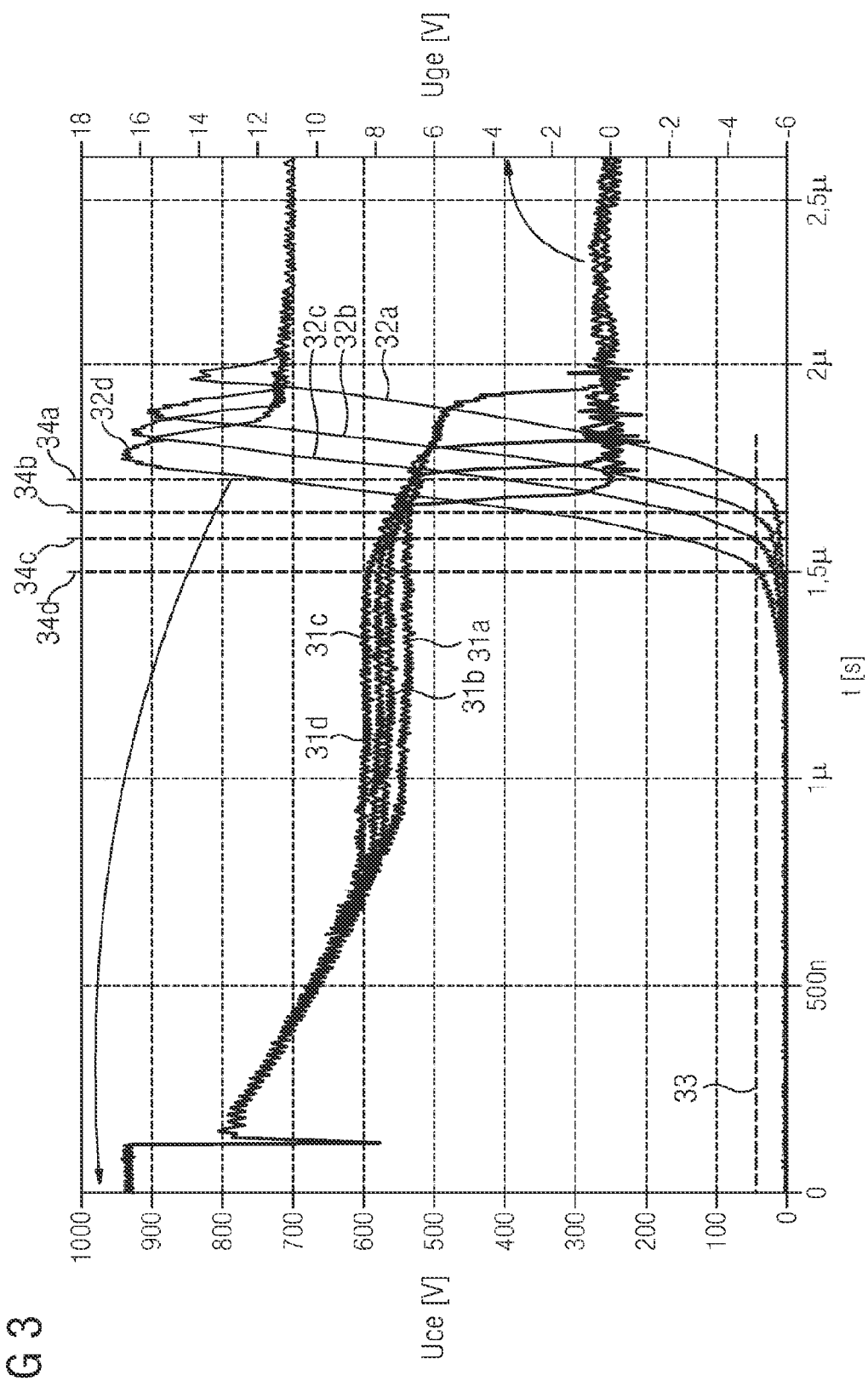
FIG. 3 shows a diagram with measurement results for the collector-emitter voltage at different collector currents incorporating teachings of the present disclosure.

In some embodiments, the driver 12 therefore carries out a modified measurement. This measurement is based on the finding that the delay time, which extends from the start of a switch-off process until a specific voltage level of the collector-emitter voltage is reached, depends on the level of the collector current. This relationship is illustrated in FIG. 3. FIG. 3 shows a series of measurements for switching operations of an IGBT at different values for the collector current. The measurement curves $31a \ldots d$ show the curve of the gate-emitter voltage $U_{GE}$ during a switch-off process that lasts about 2 μs. The measurement curve $31a$ is recorded at a collector current of $I_c$=225 A and the measurement curve $31d$ at a collector current of $I_c$=850 A. The associated courses $32a \ldots d$ of the collector-emitter voltage $U_{CE}$ are also applied.

It can be seen that if the start of the switch-off process exactly matches at about t=100 ns, the increase in the collector-emitter voltage $U_{CE}$ at different collector currents $I_c$ is shifted in time. If the point in time is considered at which the collector-emitter voltage $U_{CE}$ reaches a threshold value 33, for example 50 V, there are four different points in time $34a \ldots d$, the position of which depends directly on the collector current $I_c$. The collector current $I_c$ can be determined from this time position. From the level of the collector current, in turn, it can be concluded whether there is a fault and whether an excessively high overvoltage is to be expected due to the collector current $I_c$ being excessively high.

In this case, the threshold value 33 can be selected to be comparatively low, for example only 20% or only 10% or even 5% of the nominal voltage. When measuring $dU_{CE}/dt$, on the other hand, a usable value can only be reached when the voltage $U_{CE}$ has risen to about half the nominal voltage, i.e. later. The evaluation of the delay time until the threshold value 33 is reached results in a faster measurement and thus an increased reaction time for countermeasures.

Figure 4:
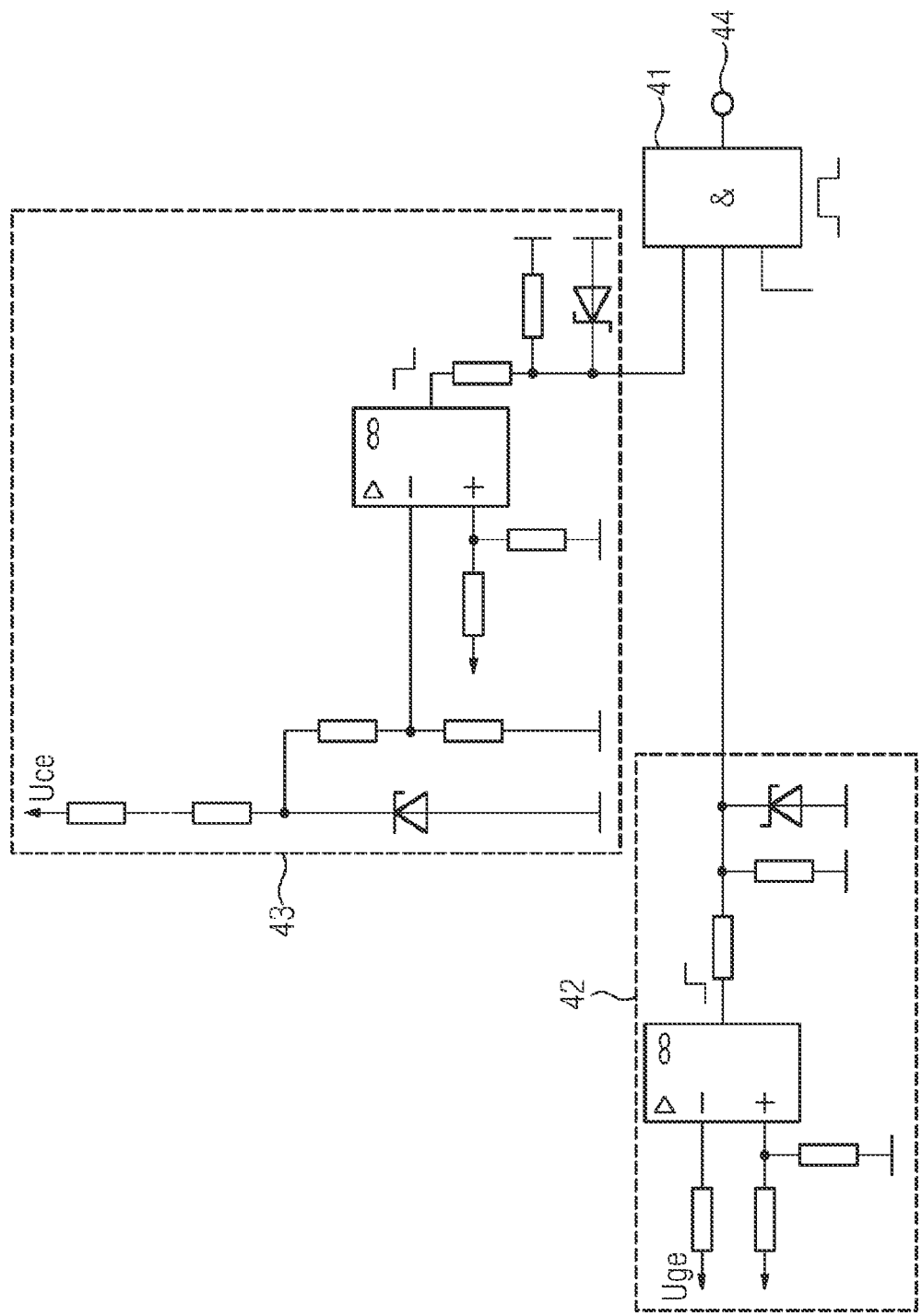
FIG. 4 shows a block diagram of a first subcircuit of a driver circuit in which the delay time is evaluated incorporating teachings of the present disclosure.
Figure 5:
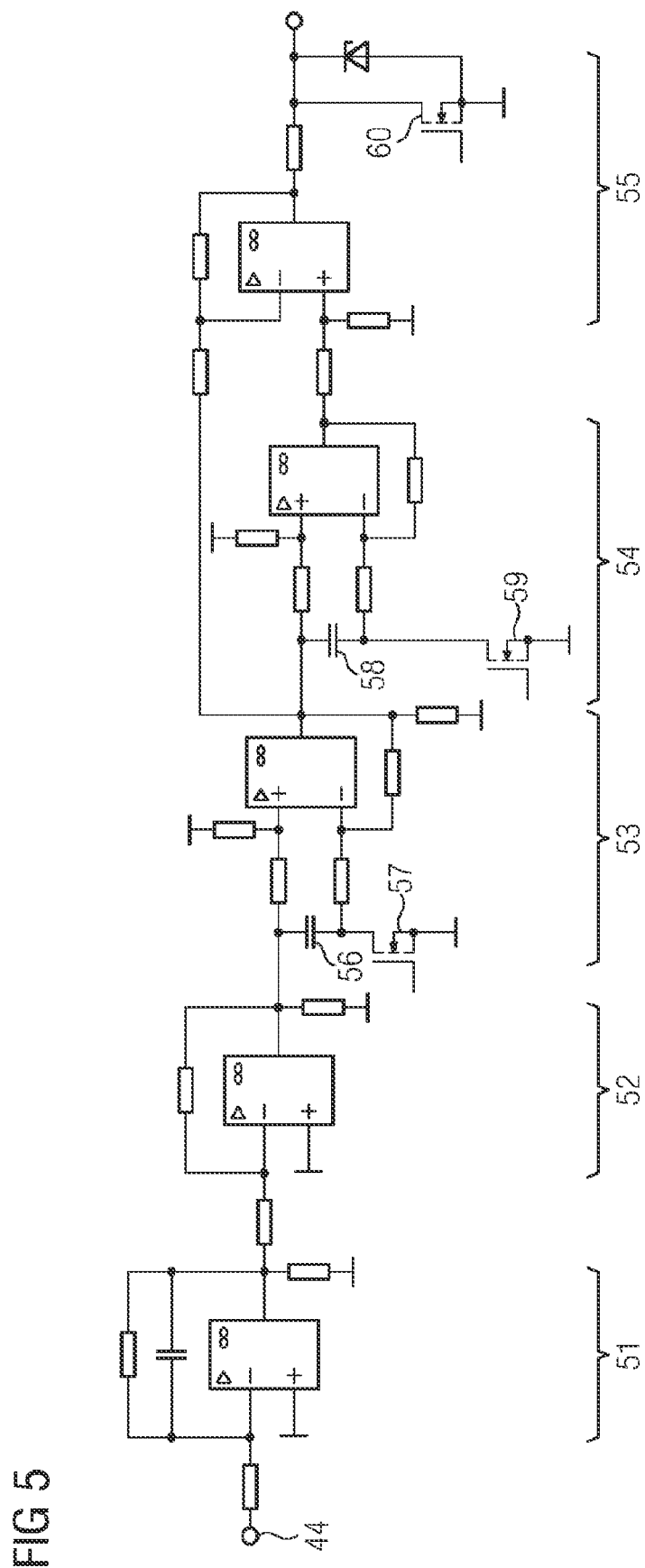
FIG. 5 shows a block diagram of a second subcircuit of the driver circuit incorporating teachings of the present disclosure.

An exemplary and simplified representation of a circuit for evaluating the delay time is given in FIGS. 4 and 5. The circuit in both figures is constructed with operational amplifiers so that the individual function blocks of the circuit are clearly recognizable. In a real circuit, these would typically be replaced by simpler semiconductor switches, and the structure would be simplified and reduced in size.

A delay time that occurs is detected with the subcircuit in FIG. 4. An AND gate 41 is fed by three input signals. A first input signal is used to detect a switch-off process by a comparator 42, with which a drop in the gate-emitter voltage $U_{GE}$ is detected. The gate-emitter voltage $U_{GE}$ is connected to the inverting input, so that a rising edge is generated as soon as the gate-emitter voltage $U_{GE}$ falls below the reference voltage.

A second input signal is generated by evaluating the collector-emitter voltage $U_{CE}$. The collector-emitter voltage $U_{CE}$ is compared in a second comparator 43 with the threshold value 33 introduced in FIG. 3. For this purpose, the collector-emitter voltage $U_{CE}$ is connected to the inverting input of an operational amplifier via a suitable voltage divider. If the collector-emitter voltage $U_{CE}$ rises above the reference value, there is a falling edge as the input signal for the AND gate.

A third input signal is derived from a driver control pulse. This is necessary because when the IGBT is switched on, a combination of the other two input signals can also occur, which corresponds to the delay time measurement. However, this process is masked out by the third input signal.

The combination of the input signals generally results in a low-level output value. Only during the time that corresponds to the delay time, i.e. during a switch-off process between the initial drop in gate-emitter voltage $U_{GE}$ and the rise in collector-emitter voltage $U_{CE}$, is there a high level at the output of the AND-gate. This output signal can be used for further processing in the subcircuit shown in FIG. 5. The subcircuits are connected at node 44.

The subcircuit of FIG. 5 can be divided roughly into five blocks. A first block 51 represents an integrator. The integrator converts the duration of the output signal of the AND gate 41 into a voltage value, the level of which represents a measure of the delay time. This voltage level is connected via an inverting amplifier 52 to a differential amplifier 53. A capacitor 56 and a MOSFET 57 are arranged between the inverting amplifier 52 and the differential amplifier. The capacitor 56 is used to hold a current value for the delay time. Charging of the capacitor can be enabled or blocked via the MOSFET 57, which is connected to a ground potential.

On the output side, the differential amplifier 53 is connected to a second differential amplifier 54. A further circuit of a second capacitor 58 and a second MOSFET 59, which are arranged analogously to the first capacitor and MOSFET 56, 57, is arranged between the two differential amplifiers. The second capacitor serves to store a previous value for the delay time and its charging can be controlled via the second MOSFET 59.

Finally, a third differential amplifier 55 is connected to the outputs of the two previous differential amplifiers 53, 54. The third differential amplifier 55 thus carries out a comparison of the two delay time values stored in the capacitors 56, 58. A third MOSFET 60 is connected to the output in such a way that the output of a control pulse by the circuit in FIG. 5 to the IGBT 10 is permitted only at specific times.

Figure 6:
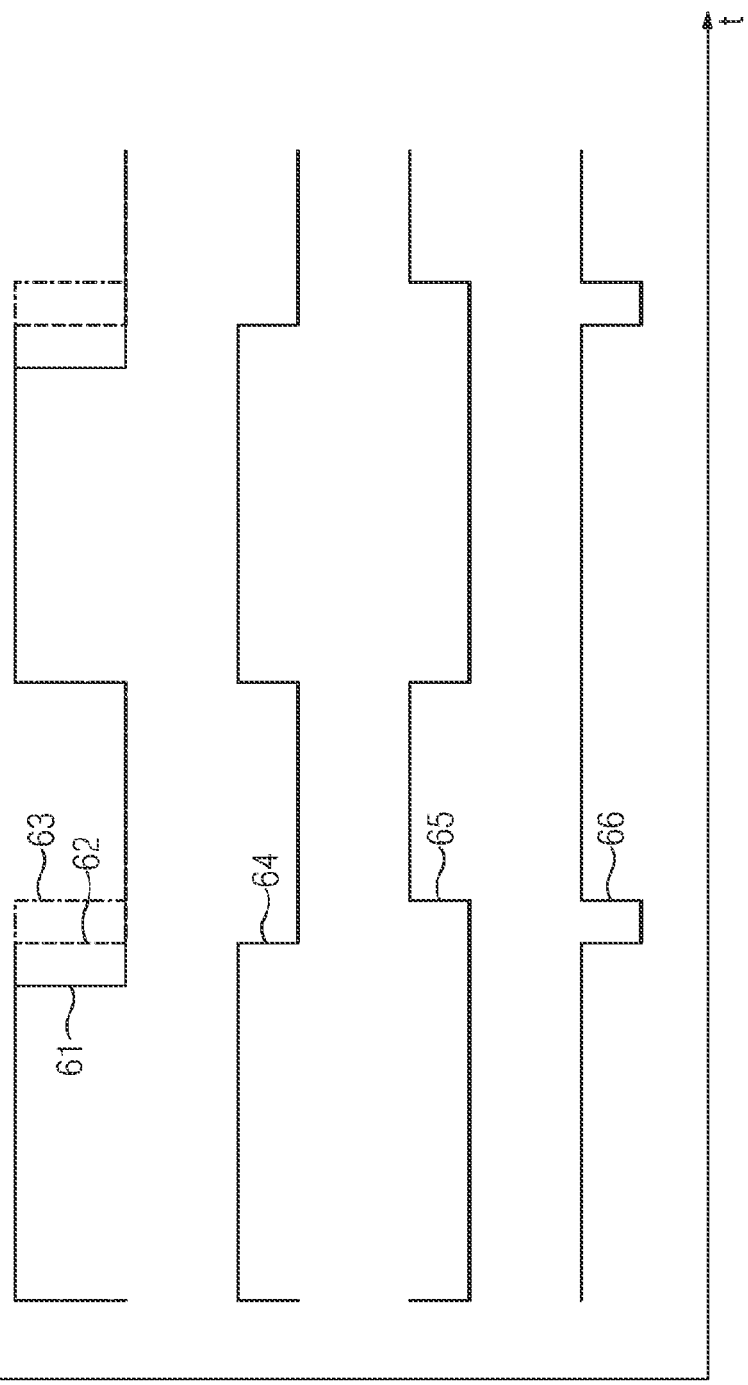
FIG. 6 shows a diagram with switching states of the IGBT and switching of the sub-circuits incorporating teachings of the present disclosure.

FIG. 6 shows a schematic time characteristic of the switching pulses over a time of two on and off phases of the IGBT 10. The switching state of the IGBT 10 is shown as the curve 61, the drive pulse for the IGBT 10 being meant here. The times that are relevant for driver 12 are the two switch-off edges of curve 61. Curve 62 present at node 44 is shown overlapping with curve 61 and shows the time range of the delay time, i.e. up until the collector-emitter voltage $U_{CE}$ has reached the threshold used. Up to this point, the first MOSFET 57 is switched on and the charging of the first capacitor 56 is allowed; the delay time is therefore saved. At the end of the delay time, the first MOSFET 57 is switched off and at the input of the third differential amplifier 55 the current and the previous delay time are present as the voltage values of the first and second capacitors 56, 58. From this point in time, the third MOSFET 60 allows a control pulse to be passed on by being switched off.

After the switch-off process, the second MOSFET 59 is switched on and thus allows the current delay time to be passed on (charged or discharged) to the second capacitor 58, with the result that the current delay time becomes the previous delay time for the next switch-off process.

The possible duration of the actual intervention in the control, i.e. the duration of switching on the third MOSFET 60 is controlled via a non-illustrated OR gate with a delay element connected upstream. A high output of the delay time measurement or of the delay element leads to the third MOSFET 60 being switched on. The delay element can, for example, have an RC element and a Schmitt trigger connected to the node in the center of the RC element.

As can be seen from the representation of the functionality of the subcircuit in FIG. 5, a comparison of the currently determined delay time with the respective previous delay time is carried out here. It is therefore only determined whether the current delay time is significantly shorter than the previous one, which points to a clearly and very suddenly increased collector current $I_c$. This means that only changes are recorded and no absolute values. The advantage of this, however, is that there is no calibration to a respective IGBT 10 and therefore the driver 12 with its circuits from FIGS. 4 and 5 does not have to be adapted to the respective IGBT 10. The temperature, another significant influencing variable, does not have to be included by means of a complex correction circuit, since in all real cases this only changes much more slowly than the collector current $I_c$, so that it has hardly any influence on the difference in the delay times between two switching operations. This significantly simplifies the design and use of the circuits.

A variable is determined with the delay time, which is therefore influenced by the collector current $I_c$, but does not correspond to this, because it is also determined by other significant influencing variables. An alternative such quantity to the delay time, which has become apparent in measurements on IGBTs, is the gate current $I_G$.

Figure 7:
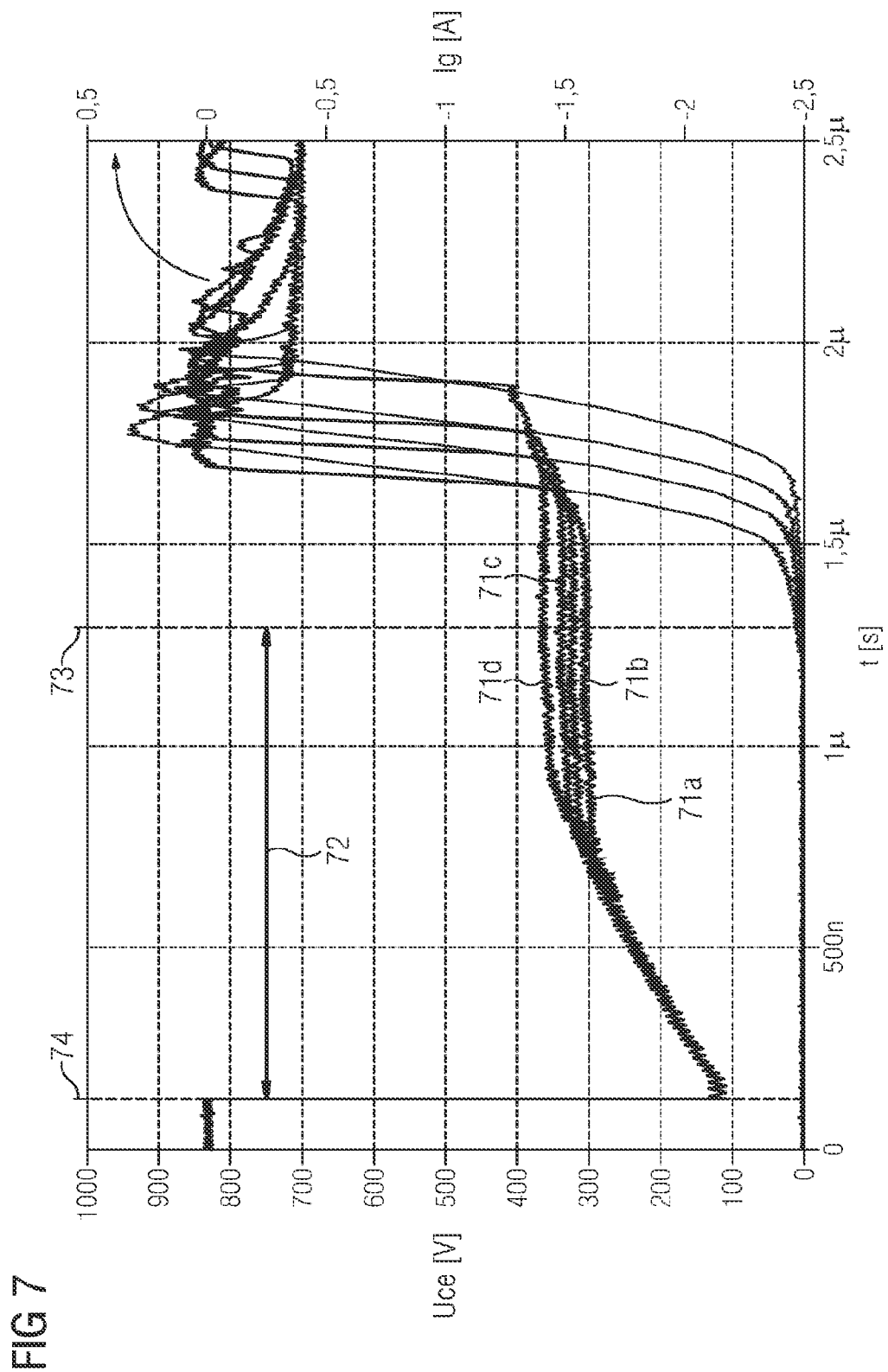
FIG. 7 shows a diagram with measurement results for the gate current at different collector currents incorporating teachings of the present disclosure.

In some embodiments, the driver 12 therefore performs an alternative measurement. This measurement is based on the finding that the level of the gate current $I_G$, which results after the expiry of a measuring time 72 after the start of a switch-off process, depends on the level of the collector $I_c$. This relationship is illustrated in FIG. 7. FIG. 7 shows a series of measurements for switching operations of an IGBT at different values for the collector current. The measurement curves 71a . . . d show the curve of the gate current $I_G$ during a switch-off process, which lasts approximately 2 µs. The measurement curve 71a is recorded at a collector current of $I_c$=225 A and the measurement curve 71d at a collector current of $I_c$=850 A. The associated courses 32a . . . d of the collector-emitter voltage $U_{CE}$ are also applied.

In order to actually determine the gate current, the current measured at a shunt resistor is integrated within a measurement period, also known as a measurement window, i.e. a quantity of charge is determined. This measurement window is adapted to the IGBT type used. For example, the measurement window can cover a time of 200 ns to 300 ns after the start of the switch-off process.

The specific point in time 73 at which the measurement is carried out results from the fact that the measuring time elapses after the start of the switch-off process at point in time 74. It can be seen in FIG. 7 that at the beginning of the switch-off process the curves 71a . . . d of the gate are not yet distinguishable, but after the measurement time has elapsed at point in time 73 there is a clear dependence on the collector current $I_c$. The processing of gate current $I_G$ can be achieved in the subcircuit according to FIG. 8. Again, this subcircuit is constructed with operational amplifiers, so that the individual functional blocks are clearly recognizable. In a real circuit, these would typically be replaced by simpler semiconductor switches, and the structure would be simplified and reduced in size.

Figure 8:
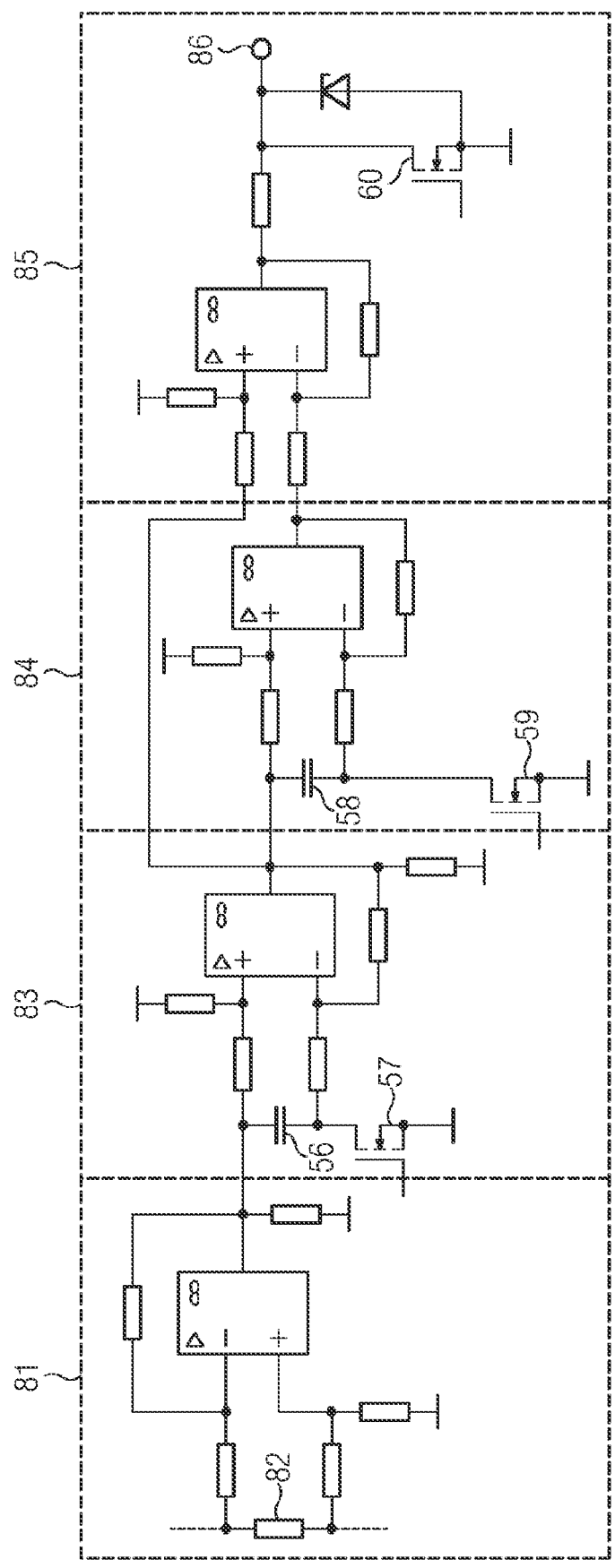
FIG. 8 shows a block diagram of a sub-circuit of the driver circuit incorporating teachings of the present disclosure.

The subcircuit of FIG. 8 can be divided roughly into four blocks. A first block 81 represents a differential amplifier and includes a shunt resistor 82 which is arranged in the gate circuit and is used to receive the gate current $I_G$.

The following function blocks 83, 84, 85 largely correspond to the blocks 53, 54, 55 in FIG. 5. Therefore, the description of their function will not be repeated here. As a result, the current gate current $I_G$ is also recorded here, compared with the previous gate current and, based on the comparison, a pulse for the output stage of the driver 12, which is present at the output 86 of the subcircuit, is derived. The MOSFETs 57, 59, 60 used in the function blocks 83, 84, 85 correspond in function and arrangement to those used in FIG. 5. The controlling takes place with a time sequence that corresponds to that of FIG. 6.

Figure 9:
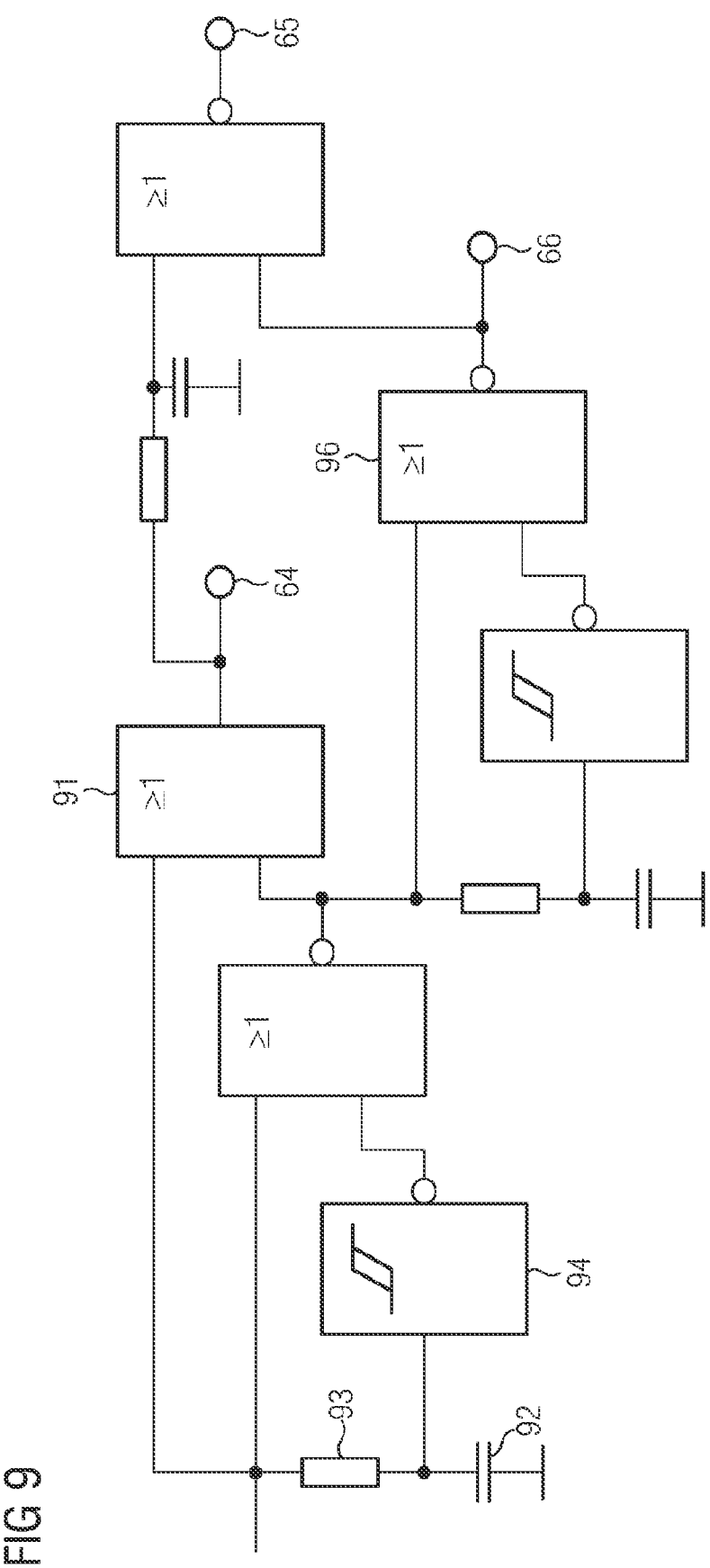
FIG. 9 shows a block diagram of a further sub-circuit.

FIG. 9 shows a block diagram of a circuit with which the switching signals 64, 65, 66 for the MOSFETs 57, 59, 60 are generated. The OR gate 91 switches on the first MOSFET 57 at least while the IGBT 10 is switched on. Via the capacitor 92 and resistor 93 as well as the inverting Schmitt trigger 94 and the NOR gate 95, the first MOSFET 57 is left switched on for a measuring period after the switch-off pulse for the IGBT 10. Once this time has elapsed, the pulse for the output stage is activated by switching on the third MOSFET 60 via the NOR gate 96. The NOR gate 97 in turn switches on the second MOSFET 59 when the other two MOSFETs 57, 60 are switched off.

In a slight modification, this circuit is also used to measure the delay time. In this case, however, the switching off of the first MOSFET 57 results from the comparison of the collector-emitter voltage $U_{CE}$ with the threshold value 33.

As can be seen from FIGS. 3 and 7, the point in time 34a . . . d, 73, at which information on the level of the collector current $I_c$ is present in the form of a change compared to a previous switch-off process, is before the points in time 24, 25, that can be reached with a $dU_{CE}/dt$ or $dI_c/dt$ measurement. In the case of IGBTs 10 that switch off quickly, several 100 ns of time are gained within which a reaction to an overcurrent can take place.

LIST OF REFERENCE CHARACTERS

10 IGBT
11 Gate terminal
12 Driver circuit
20 Higher-level control
21 Curve of the collector-emitter voltage
22 Curve of the collector current
23 Point in time of occurrence of an overvoltage
24 Point in time of the $dI_c/dt$ measurement
25 Point in time of the $dU_{CE}/dt$ measurement
31a . . . d Curve of the gate-emitter voltage
32a . . . d Curve of the collector-emitter voltage
33 Threshold value
34a . . . d Points in time
41 AND gates
42, 43 Comparators
44 Node
51 . . . 55 Function blocks
56, 58 Condenser
57, 59, 60 MOSFET
61 . . . 65 Switching states
71a . . . d Curve of the gate current
72 Measurement time
73 Point in time
74 Start of the switch-off process
81, 83 Function blocks
82 Shunt resistor
91 OR gates
92 Condenser
93 Resistance
94 Schmitt trigger
96 NOR gates

What is claimed is:

1. A driver circuit for controlling a semiconductor switch, the circuit comprising:
    a contact for connection to a control terminal of the semiconductor switch; and
    a device to carry out a measurement of a value dependent on the level of the current flowing through the semiconductor switch, in the course of a switch-off process of the semiconductor switch;
    wherein the value is either the level of the gate current at a point in time or in a time window after the start of the switch-off process or a timespan from the start of the switch-off process until a definable threshold value of the voltage drop across the semiconductor switch is reached; and
    depending on the size of the value, the device activates a control measure to reduce the change over time in the current flowing through the semiconductor switch.

2. The driver circuit as claimed in claim 1, wherein the control measure includes temporarily switching the semiconductor back on.

3. The driver circuit as claimed in claim 1, wherein the control measure includes changing the gate voltage as a control measure.

4. The driver circuit as claimed in claim 1, wherein the control measure includes switching to a higher gate resistance.

5. The driver circuit as claimed in claim 1, wherein the device transmits a signal to a higher-level controller based on the magnitude of the value.

6. The driver circuit as claimed in claim 1, wherein the device:
    stores the measured value during a first switch-off process;
    determines a difference between the value measured in the subsequent switch-off process and the stored value during a subsequent switch-off process; and
    controls the control measure based on the difference.

7. The driver circuit as claimed in claim 1, wherein the device determines:
    a result value from the measured value using a stored value table; and
    controls the control measure based on the result value.

8. The driver circuit as claimed in claim 1, wherein the device uses at most 10% of the nominal voltage of the semiconductor switch as a threshold value of the collector-emitter voltage.

9. The driver circuit as claimed in claim 1, wherein the device defines a start of a switch-off process using a threshold value for the gate voltage.

10. The driver circuit as claimed in claim 1, wherein the device defines a start of a switch-off process using a control command from the higher-level controller.

11. The driver circuit as claimed in claim 1, wherein:
    the device determines a start of a switch-off process based on the value of a control voltage; and
    the control voltage is a voltage value between an output stage of the driver circuit and a gate resistor.

12. The driver circuit as claimed in claim 1, wherein the device defines a time in which it is possible to carry out the control measure by means of a delay circuit.

13. The driver circuit as claimed in claim 1, wherein the device sets a time in which the implementation of the control measure is possible, determined using a voltage measurement at a Z-diode connected to the collector-emitter voltage by a voltage divider.

14. A system comprising:
    a semiconductor switch;
    a contact for connection to a control terminal of the semiconductor switch; and
    a device to carry out a measurement of a value dependent on the level of the current flowing through the semiconductor switch, in the course of a switch-off process of the semiconductor switch;
    wherein the value is either the level of the gate current at a point in time or in a time window after the start of the switch-off process or a timespan from the start of the switch-off process until a definable threshold value of the voltage drop across the semiconductor switch is reached; and
    depending on the size of the value, the device activates a control measure to reduce the change over time in the current flowing through the semiconductor switch.

15. A method for controlling a semiconductor switch, the method comprising:
    measuring a value dependent on the level of the current flowing through the switch is carried out during the course of a switch-off process of the semiconductor switch;
    wherein the value is either the level of the gate current at a point in time after starting the switch-off process or a timespan from the start of the switch-off process until a definable threshold value of the voltage drop across the switch is reached and depending on the size of the value, a control measure is taken to reduce the change over time in the current flowing through the semiconductor switch.

* * * * *